(12) United States Patent
Pathangi et al.

(10) Patent No.: US 10,672,588 B1
(45) Date of Patent: Jun. 2, 2020

(54) USING DEEP LEARNING BASED DEFECT DETECTION AND CLASSIFICATION SCHEMES FOR PIXEL LEVEL IMAGE QUANTIFICATION

(71) Applicant: KLA-TENCOR CORPORATION, Milpitas, CA (US)

(72) Inventors: Hari Pathangi, Chennai (IN); Sivaprrasath Meenakshisundaram, Chennai (IN); Tanay Bansal, Chennai (IN)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/249,337

(22) Filed: Jan. 16, 2019

(30) Foreign Application Priority Data

Nov. 15, 2018 (IN) .............................. 201841042919

(51) Int. Cl.
*H01J 37/22* (2006.01)
*H01J 37/28* (2006.01)
*G06T 7/00* (2017.01)

(52) U.S. Cl.
CPC .......... *H01J 37/222* (2013.01); *G06T 7/0004* (2013.01); *H01J 37/28* (2013.01); *G06T 2207/10061* (2013.01); *G06T 2207/20081* (2013.01); *G06T 2207/30148* (2013.01); *H01J 2237/2448* (2013.01); *H01J 2237/2806* (2013.01); *H01J 2237/2809* (2013.01)

(58) Field of Classification Search
CPC .......... H01J 37/00; H01J 37/02; H01J 37/222; H01J 37/26; H01J 37/261; H01J 37/28; G06T 7/0004

USPC .......................................... 250/306, 307, 311
See application file for complete search history.

(56) References Cited

U.S. PATENT DOCUMENTS

| | | | |
|---|---|---|---|
| 6,067,376 A | 5/2000 | Li | |
| 6,292,582 B1 | 9/2001 | Lin et al. | |
| 2002/0130262 A1* | 9/2002 | Nakasuji | G01N 23/225 250/311 |
| 2003/0023404 A1 | 1/2003 | Moselhi et al. | |
| 2004/0120569 A1 | 6/2004 | Hung et al. | |
| 2018/0060702 A1* | 3/2018 | Ma | G06K 9/6269 |

FOREIGN PATENT DOCUMENTS

KR 20180094111 A 8/2018

OTHER PUBLICATIONS

Bisschop, Peter De, Stochastic Effects in EUV Lithography: Random, Local CD Variability, and Printing Failures, Journal of Micro/Nanolithography, MEMS, and MOEMS, 16(4), 041013, 2017, pp. 041013-1 through 041013-17. (Year: 2017).*

(Continued)

*Primary Examiner* — Jason L McCormack
(74) *Attorney, Agent, or Firm* — Hodgson Russ LLP

(57) ABSTRACT

A heat map of probable defects in an image can be represented as a matrix of defect probability index corresponding to each pixel. The image may be generated from data received from a detector of a scanning electron microscope or other inspection tools. A number of pixels in the image that exceed a corresponding threshold in the matrix can be quantified.

18 Claims, 14 Drawing Sheets

(56) References Cited

OTHER PUBLICATIONS

De Bisschop, Stochastic Effects in EUV Lithography: Random, Local CD Variability, and Printing Failures, J. of Micro/Nanolithography, MEMS, and MOEMS, 2017, vol. 16(4).
De Bisschop & Hendrickx, Stochastic Effects in EUV Lithography, Proc. of SPIE, 2018, vol. 10583.
WIPO, ISR for PCT/US2019/061578, dated Mar. 16, 2020.

* cited by examiner

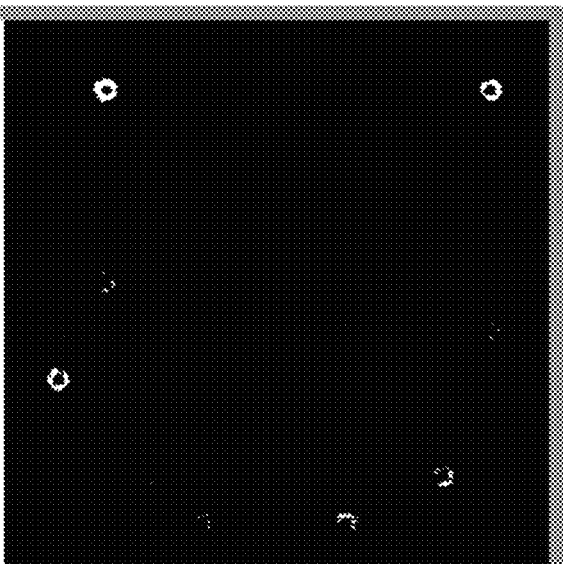
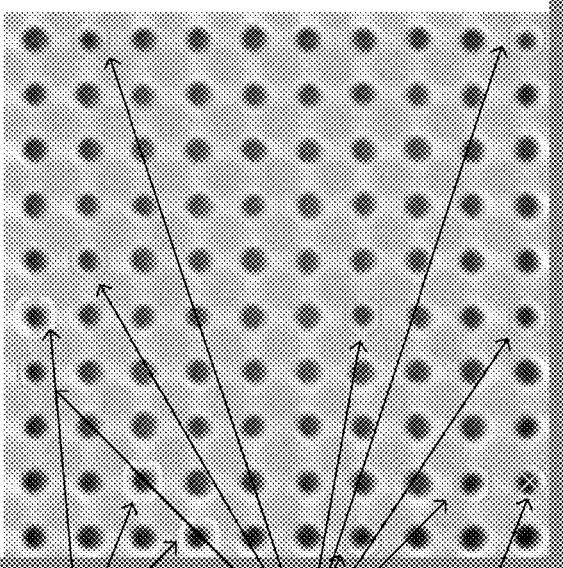
FIG. 8

| 17.9 | 16.7 | 16.1 | 16.1 | 17.8 | 16.4 | 17.4 | 16.9 | 16.5 | 16.9 |
|---|---|---|---|---|---|---|---|---|---|
| 17.5 | 17.4 | 18.0 | 16.7 | 16.2 | 18.5 | 15.2 | 17.0 | 15.3 | 15.2 |
| 18.3 | 16.5 | 17.2 | 17.7 | 17.2 | 18.3 | 15.1 | 15.6 | 17.5 | 16.4 |
| 15.8 | 16.4 | 15.0 | 16.6 | 17.0 | 18.2 | 17.3 | 17.7 | 15.1 | 16.3 |
| 16.3 | 16.1 | 19.5 | 17.5 | 18.7 | 17.0 | 14.4 | 15.9 | 16.6 | 15.3 |
| 16.4 | 15.9 | 16.6 | 17.0 | 18.2 | 17.6 | 18.6 | 14.5 | 16.1 | 13.7 |
| 11.6 | 16.6 | 18.6 | 16.2 | 16.8 | 16.9 | 17.7 | 17.5 | 16.8 | 16.8 |
| 16.8 | 16.9 | 16.9 | 16.9 | 16.0 | 16.2 | 16.7 | 16.9 | 18.4 | 16.2 |
| 16.6 | 16.5 | 17.4 | 18.8 | 17.9 | 14.6 | 16.1 | 18.3 | 15.6 | 12.8 |
| 16.9 | 16.9 | 16.3 | 16.4 | 16.9 | 18.0 | 15.3 | 17.3 | 17.4 | 16.1 |

FIG. 9

| 19.3 | 18.5 | 17.5 | 18.2 | 22.5 | 21.4 | 19.4 | 18.7 | 19.2 | 20.0 |
|------|------|------|------|------|------|------|------|------|------|
| 19.0 | 20.4 | 20.9 | 19.3 | 19.6 | 19.7 | 19.2 | 19.5 | 18.6 | 17.8 |
| 18.9 | 20.2 | 19.5 | 20.1 | 21.4 | 19.3 | 19.8 | 18.5 | 21.3 | 19.9 |
| 19.1 | 17.8 | 19.0 | 20.0 | 19.1 | 20.2 | 19.4 | 19.4 | 19.1 | 19.0 |
| 19.9 | 19.6 | 19.7 | 20.7 | 20.2 | 19.3 | 20.4 | 20.4 | 18.6 | 17.4 |
| 17.5 | 19.9 | 19.2 | 18.3 | 21.6 | 19.0 | 20.9 | 18.4 | 18.3 | 17.4 |
| 15.6 | 20.0 | 19.7 | 18.6 | 18.7 | 19.6 | 19.9 | 19.7 | 19.3 | 19.9 |
| 19.1 | 19.4 | 20.8 | 21.5 | 19.5 | 18.1 | 18.8 | 18.2 | 20.4 | 17.8 |
| 19.7 | 18.1 | 21.0 | 19.8 | 20.7 | 18.2 | 20.7 | 21.8 | 17.7 | 17.9 |
| 19.2 | 18.6 | 19.3 | 18.3 | 18.4 | 19.2 | 18.8 | 19.8 | 18.8 | 18.8 |

FIG. 10

|      | 14.7 | 15.5 | 16.3 | 17.2 | 15.9 | 14.4 | 17.1 | 16.7 | 14.8 |
| 16.9 | 17.3 | 15.4 | 17.1 | 16.6 | 14.8 | 14.0 | 13.0 | 15.8 | 16.4 |
| 17.4 | 16.8 | 14.6 | 14.2 | 17.4 | 16.1 | 14.8 | 15.3 | 16.9 | 16.5 |
| 14.1 | 14.0 | 17.7 | 16.7 | 15.2 | 17.3 | 14.9 | 16.4 | 14.6 | 16.1 |
| 16.7 | 15.7 | 17.4 | 16.9 | 17.2 | 18.2 | 14.2 | 13.3 | 15.6 | 14.3 |
| 13.5 | 14.4 | 15.9 | 15.9 | 18.0 | 15.2 | 15.9 | 13.1 | 15.4 | 12.7 |
|      | 14.5 | 17.1 | 15.8 | 16.6 | 14.8 | 17.2 | 17.9 | 14.4 | 18.4 |
| 14.6 | 14.2 | 17.7 | 17.3 | 16.6 | 15.7 | 17.5 | 14.3 | 17.3 | 16.1 |
| 15.4 | 13.8 | 16.4 | 16.3 | 15.8 | 14.5 | 15.0 | 17.4 | 13.9 | 14.9 |
| 13.5 | 15.5 | 14.7 | 14.3 | 15.4 | 15.6 | 14.3 | 18.0 | 17.4 | 15.9 |

FIG. 11

| 18.5 | 13.7 | 16.5 | 16.9 | 18.3 | 17.4 | 17.1 | 16.7 | 17.0 | 13.2 |
|------|------|------|------|------|------|------|------|------|------|
| 15.8 | 18.3 | 16.2 | 18.0 | 17.4 | 16.9 | 17.0 | 16.8 | 16.7 | 15.6 |
| 17.1 | 17.2 | 17.6 | 18.1 | 17.7 | 18.0 | 17.5 | 19.1 | 16.9 | 18.0 |
| 17.5 | 16.2 | 16.0 | 18.3 | 16.4 | 18.5 | 16.6 | 18.2 | 16.9 | 17.9 |
| 16.4 | 15.2 | 19.1 | 17.2 | 19.2 | 17.2 | 17.7 | 17.3 | 17.4 | 17.0 |
| 15.6 | 16.3 | 16.9 | 16.2 | 18.3 | 18.6 | 15.3 | 16.7 | 16.5 | 15.2 |
| 14.5 | 17.7 | 18.8 | 17.3 | 17.3 | 17.9 | 18.1 | 18.2 | 18.2 | 18.8 |
| 16.1 | 16.8 | 19.6 | 16.0 | 16.4 | 16.5 | 17.4 | 18.4 | 18.6 | 15.7 |
| 17.0 | 16.0 | 15.7 | 19.7 | 16.5 | 16.1 | 16.8 | 19.7 | 14.7 | 15.2 |
| 15.9 | 18.1 | 16.9 | 15.5 | 16.9 | 17.9 | 15.1 | 16.8 | 18.2 | 17.6 |

FIG. 12

| A |  | Real defect capture (CH shrink > 10%) | 26/30 |
| B |  | Acceptable nuisance (CH shrink = 8-10%) | 19/23 |
| C |  | Gross nuisance (CH shrink ≤≤ 10%) | 4/23 |
| D | | Acceptable miss (CH shrink = 8-10%) | 4/4 |
| E | | Defect type not annotated | 2 |
| F |  | Gross miss (CH shrink >> 10%) | 0/30 |
FIG. 13

USING DEEP LEARNING BASED DEFECT DETECTION AND CLASSIFICATION SCHEMES FOR PIXEL LEVEL IMAGE QUANTIFICATION

CROSS-REFERENCE TO RELATED APPLICATIONS

This application claims priority to the Indian patent application filed Nov. 15, 2018 and assigned App. No. 201841042919, the disclosure of which is hereby incorporated by reference.

FIELD OF THE DISCLOSURE

This disclosure relates to defect detection and classification.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process induced failures, in some cases, tend to be systematic. That is, process-induced failures tend to fail at predetermined design patterns often repeated many times within the design. Elimination of spatially-systematic, electrically-relevant defects can have an impact on yield.

Defect review typically involves high resolution imaging and classification of defects that were flagged by an inspection process using either a high magnification optical system or a scanning electron microscope (SEM). Defect review is typically performed at discrete locations on specimens where defects have been detected by inspection. The higher resolution data for the defects generated by defect review is more suitable for determining attributes of the defects such as profile, roughness, or more accurate size information.

Optical inspection of a semiconductor wafer during manufacturing is generally a slow, manual process. Defect teams at semiconductor fabrication plant (fabs) usually use optical tools for wafer inspection, but typically perform SEM review of defects for verification. Thus, for every layer inspected on an optical inspection tool, a sampled population of defects is then reviewed on an SEM tool. Manual classification of the reviewed defects is tedious and time-consuming. Fabs use automatic detection and classification schemes to save the time and effort involved in defect classification. However, the automatic detection and classification schemes have limitations and are not a replacement for a human classification. Besides requiring large computation power, automatic detection and classification schemes are prone to nuisance or instances of multiple, non-important defects. An optimal inspection recipe for a semiconductor layer should detect as many defects of interest (DOIs) as possible while maintaining a substantially low nuisance rate.

Previously, pixel level quantification of defects used edge detection and computation or grey level difference based algorithms. These techniques are not flexible for process variation-induced changes in the structures of interest. Grey level changes caused by imaging artefacts are known to induce sources of error in the computation. Distinguishing between similar looking intended and process-induced random defect modes may be challenging or even impossible.

Therefore, improved techniques and systems for defect detection and classification are needed.

BRIEF SUMMARY OF THE DISCLOSURE

A system is provided in a first embodiment. The system comprises an electron beam source that generates an electron beam; a stage configured to hold a wafer in a path of the electron beam; a detector configured to receive the electron beam returned from the wafer; and a processor in electronic communication with the detector. The processor is configured to represent a heat map of probable defects in an image as a matrix of defect probability index corresponding to each pixel and quantify a number of pixels in the image that exceed a corresponding threshold in the matrix. The image is generated from data received from the detector.

The system can further include a deep learning module operated by the processor. The deep learning module can be configured to receive the image, perform defect detection on the image, and perform defect classification on the image.

In an instance, the processor is further configured to determine the heat map.

The corresponding threshold for one of the pixels can be at a same location on the image as the one of the pixels.

The quantifying can be used in pixel level image quantification.

The probable defects can be EUV stochastics or critical dimension defects.

The image may be a scanning electron microscope image

A method is provided in a second embodiment. The method comprises representing a heat map of probable defects in an image as a matrix of defect probability index corresponding to each pixel using a processor and quantifying, using the processor, a number of pixels in the image that exceed a corresponding threshold in the matrix. The image is generated from data received from a detector.

The method can further include receiving the image at the processor, performing defect detection on the image using a deep learning module of the processor, and performing defect classification on the image using the deep learning module of the processor.

In an instance, the method further includes determining the heat map using the processor.

The corresponding threshold for one of the pixels can be at a same location on the image as the one of the pixels.

The quantifying can be used in pixel level image quantification.

The probable defects can be EUV stochastics or critical dimension defects.

The image may be a scanning electron microscope image.

In an instance, the method further comprises directing an electron beam at the wafer, collecting electrons returned from the wafer with a detector, and generating, using the processor, the image of the wafer.

A non-transitory computer readable medium storing a program can be configured to instruct a processor to execute the method of the second embodiment.

DESCRIPTION OF THE DRAWINGS

For a fuller understanding of the nature and objects of the disclosure, reference should be made to the following detailed description taken in conjunction with the accompanying drawings, in which:

FIG. 8 illustrates a chart of deviation percentage for diameter of individual contact holes from the average diameter of the 1×1 μm SEM field of view (upper left), a binary image showing the pixels that are considered defective after being thresholded (upper right), the 1×1 μm SEM image of the 10×10 contact hole matrix (bottom right), and results (bottom left) for the region of FIG. 4 with the thick box and value of 17.1;

FIG. 9 is a chart of critical dimension diameter of the contact holes in the SEM image of FIG. 5;

FIG. 10 is a chart of critical dimension diameter of the contact holes in the SEM image of FIG. 6;

FIG. 11 is a chart of critical dimension diameter of the contact holes in the SEM image of FIG. 7;

FIG. 12 is a chart of critical dimension diameter of the contact holes in the SEM image of FIG. 8;

FIG. 13 is a table of results for the images of FIGS. 5-8; and

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein use deep learning-based defect detection and/or classification networks for pixel level image quantification. For example, deep learning can be used for pixel level quantification of SEM images. This can be used in applications like extreme ultraviolet (EUV) stochastics rate quantification or critical dimension (CD) measurements/comparison. Embodiments disclosed herein can be integrated in the existing defect detection or classification schemes for review tools or inspection tools.

Deep learning-based defect detection and classification algorithms can provide pixel level SEM image quantification. A pixel level quantification of images may be needed by semiconductor manufacturers. For example, pixel level quantification can be used with critical dimension measurements when a particular geometric parameter of the structure like pattern width, gap, distance, or diameter is measured by quantifying the number of pixels between two edges or corners of a structure. Pixel level quantification also can be used with EUV stochastics. An objective of an EUV stochastics application is to quantify the number of defective pixels in a given SEM image that give raise to particular defect modes. These defective pixels are neither hard repeaters nor are they completely random, like process defects. For these applications and other applications, quantifying the images (e.g., SEM images) at a pixel level accuracy may be needed to provide desired results. Pixel level accuracy may be needed because the number of failed pixels and good pixels are counted. Stochastics, for example, can be caused by molecular level inaccuracies in the patterning process, which leads to pixel or even sub-pixel level failures on the wafer. Deep learning-based defect detection and classification algorithms can provide quantification of SEM images at a pixel level accuracy.

Embodiments disclosed herein use deep learning-based defect detection and classification (like SMARTS from KLA-Tencor Corporation) for pixel quantification. This is achieved by training a particular image set in an appropriate way such that the deep learning algorithm only flags DOIs, while not flagging the random process induced defects even though they are structurally or morphologically similar to the DOIs.

Figure 1:
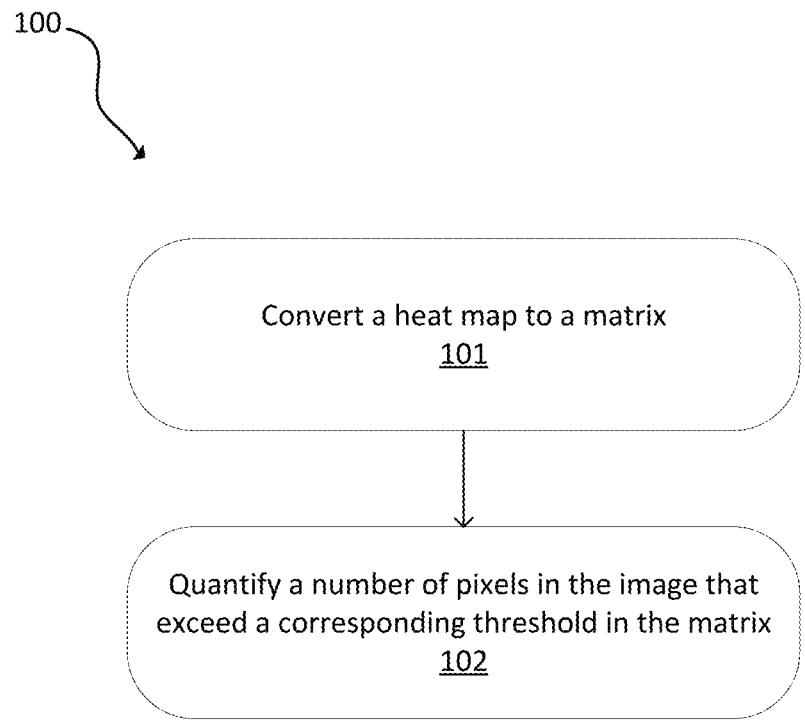
FIG. 1 is a flowchart of an embodiment of a method in accordance with the present disclosure.

Results from deep learning-based defect detection and classification can be quantified. FIG. 1 is a flowchart of an embodiment of a method 100.

At 101, a heat map of probable defects in an image, such as an SEM image, is represented as a matrix of defect probability index corresponding to each pixel. The probable defects may be EUV stochastics, critical dimension defects, bridges, line breaks, protrusions, missing contacts, merged contacts, shrunk contacts, or other types of defects. The image is generated from data received from a detector, such as a detector in an SEM.

The image can be a grey level image or can be a black and white image. The matrix can be zeroes and ones. Zeroes may correspond to defects. With grey level images, differences can be artificially induced (e.g., artefacts) or process variations. Such differences may not be defects.

At 102, a number of pixels in the image that exceed a corresponding threshold in the matrix are quantified. The corresponding threshold for one of the pixels may be at a same location on the image as that pixel. Thus, each pixel may have a threshold, part of an image may have a threshold, or a whole image may have a threshold. Step 102 can quantify a number of pixels that fail in an image or part of an image. The quantification can be expressed as a number or as a percentage of the total pixels. Pixels less than a threshold are considered not defective while pixels equal to or more than the threshold are considered defective in this instance, though pixels equal to or less than the threshold may be considered defective in another instance.

A nuisance rate can be tuned to required levels using the detection threshold parameter. Thus, the threshold can be tuned depending on the application or desired sensitivity.

Quantifying the pixels may use or include pixel level image quantification.

The steps 101 and 102 can be performed in real-time during defect detection and defect classification. Steps 101 and 102 may be performed on a processor. The method 100 may be stored on a non-transitory computer readable medium, such as the electronic data storage unit 209 in FIG. 14.

In an instance, the image is received at the processor. Defect detection and defect classification are performed on the image using a deep learning module of the processor. The heat map may be generated by the processor. The deep learning module can be trained with, for example, exemplary images with defect codes. In an instance, contact hole images are used to train the deep learning module. The contact hole size relative to an ideal size for the contact holes can be used to identify defects.

Defect detection and classification may provide a quantitative output. The quantitative output can be used for quantification. Non-quantitative output may be more difficult to use for quantification calculations.

Deep learning-based pixel quantification can be sensitive to real DOIs while successfully ignoring random process induced variations. Embodiments disclosed herein can be accurate down to +/−2% accuracy in critical dimension predictions from a training set, which is much lower than error budgets in existing techniques. In an instance using embodiments disclosed herein, sensitivity down to +/−1% accuracy in critical dimension predictions beyond intended or random process induced critical dimension modulations is possible.

The embodiments disclosed herein can be integrated in existing detection platforms or classification platforms and can use of the existing parameter space for optimization.

Figure 2:
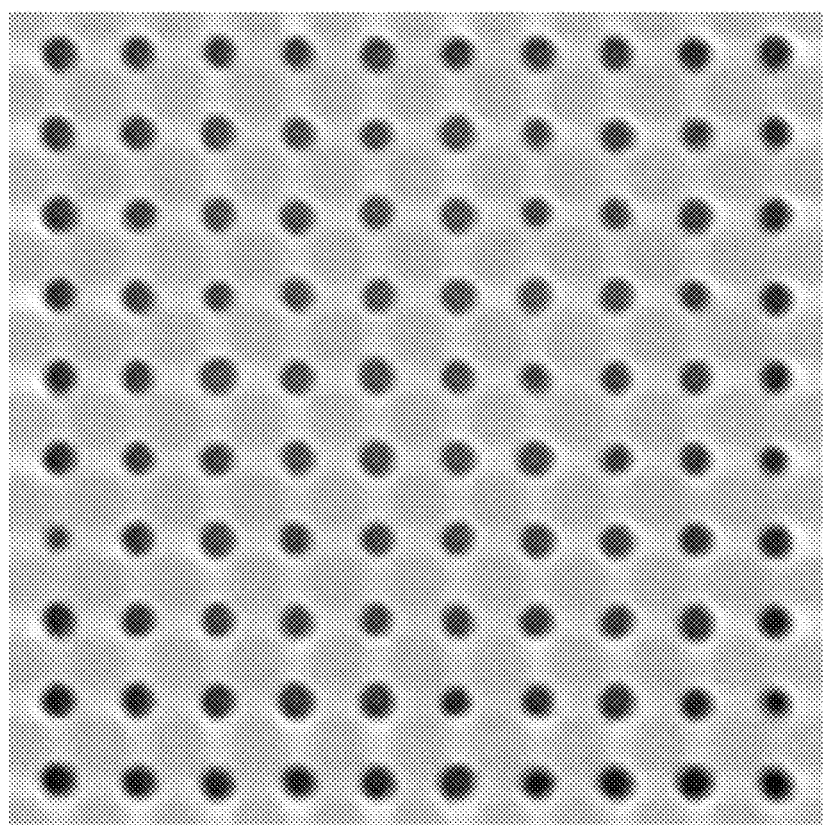
FIG. 2 is an exemplary SEM image.

In an example, a test layer of EUV contact hole (CH) array after development inspection (ADI) step (post-lithography) was used. However, the techniques disclosed herein can be valid for any non-ADI step. The test set uses an SEM image with a 0.5 μm field of view. The SEM image can have 100 contact holes like that shown in FIG. 2 or can have other numbers of contact holes.

The contact holes that are smaller in size by more than 10% of the mean critical dimension of the respective field of view are considered defective for this example. However, any limit can be applied base on manufacturing requirements.

The deep learning based defect detection algorithm is trained and used to identify contact holes in a verification set of images that are smaller than the rest of the contact holes in a particular image by a certain percent. If the deep learning approach can identify defective contact holes, then it can be used to quantify the number of defective pixels in an image. Pixel level quantification has many applications, including quantifying the EUV stochastics failure rate. EUV stochastics failures can exhibit themselves by critical dimension variation of structures over smaller scale areas or by having missing structures (e.g., pixels) in images.

A focus exposure matrix (FEM) wafer of contact hole arrays exposed by EUV lithography can be used as a test material for this example. One SEM image (0.5 μm field of view) can be generated for every die on the wafer. Each SEM image may have 100 contact holes in it.

Once the heat map is generated, this heat map is converted into a matrix of probability indices that represent the probability of each pixel being defective (e.g., on a scale from 0-100). Depending on the threshold that applied, pixels with probability indices of above a particular index are considered defective. The sum total of such pixels in a given SEM image or optical patch is given as the total number of failing pixels. This can be normalized over the total number of pixels in the image and presented as stochastics failure rate in the data.

A training set can be further optimized by, for example, factoring in images with varying average critical dimension (e.g., diameter) to reduce nuisance further. D2DB enabled training, such as with design clips as reference, also can result in a nuisance reduction for pixel level quantification. D2DB is a technique of defect detection where the semiconductor or device design is used as a reference. A SEM image or an optical patch is compared to the design clip of the particular location and any anomaly in the images with respect to the design is flagged as defective pixel(s).

The deep learning algorithm may be sensitive to small critical dimension changes, so it may be used to assess local critical dimension variations across a structure. Besides providing a way to quantify defects, determining the quantification can be implemented to improve performance of the algorithm used for pixel level defect detection.

FIGS. 3-13 illustrate tuning a nuisance rate to required levels using the detection threshold parameter. Depending on the average CD of one population of contact holes, the threshold (Thr) is different to provide optimal detection results.

Figure 3:
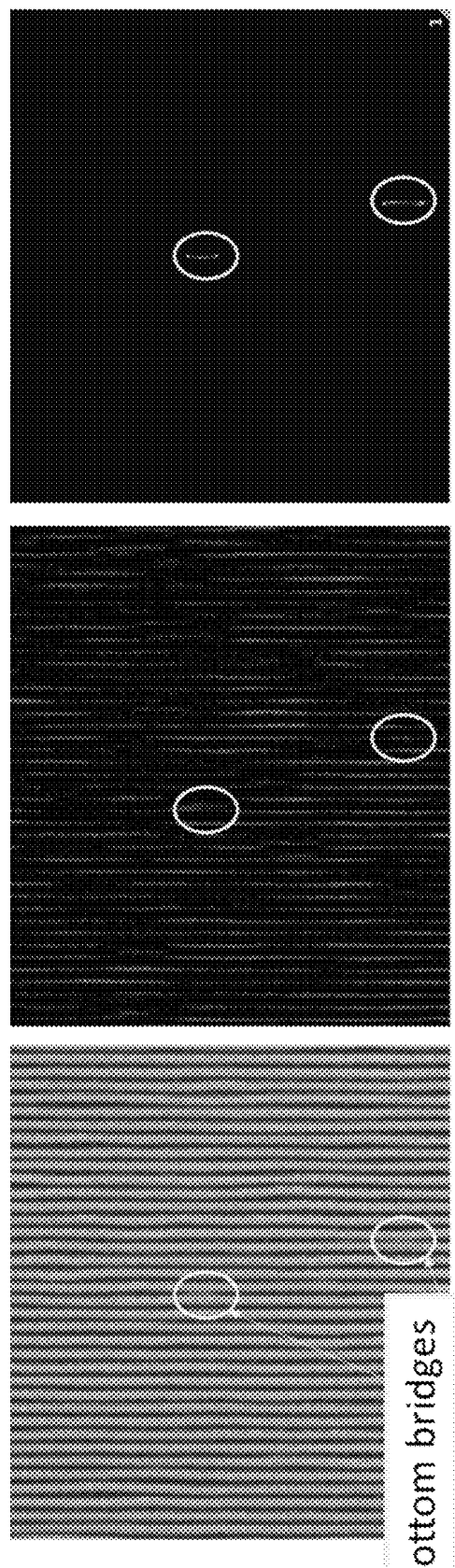
FIG. 3 includes another exemplary SEM image with two bottom bridges (left), results of a conventional algorithm (center), and results of a SMARTS algorithm (right)

FIG. 3 includes an exemplary SEM image with two bottom bridges (left), results of a conventional algorithm (center), and results of a SMARTS algorithm (right). The SMARTS deep-learning engine can detect and classify defects in SEM images better than conventional algorithms. The conventional algorithm in FIG. 3 has high noise.

Figure 4:
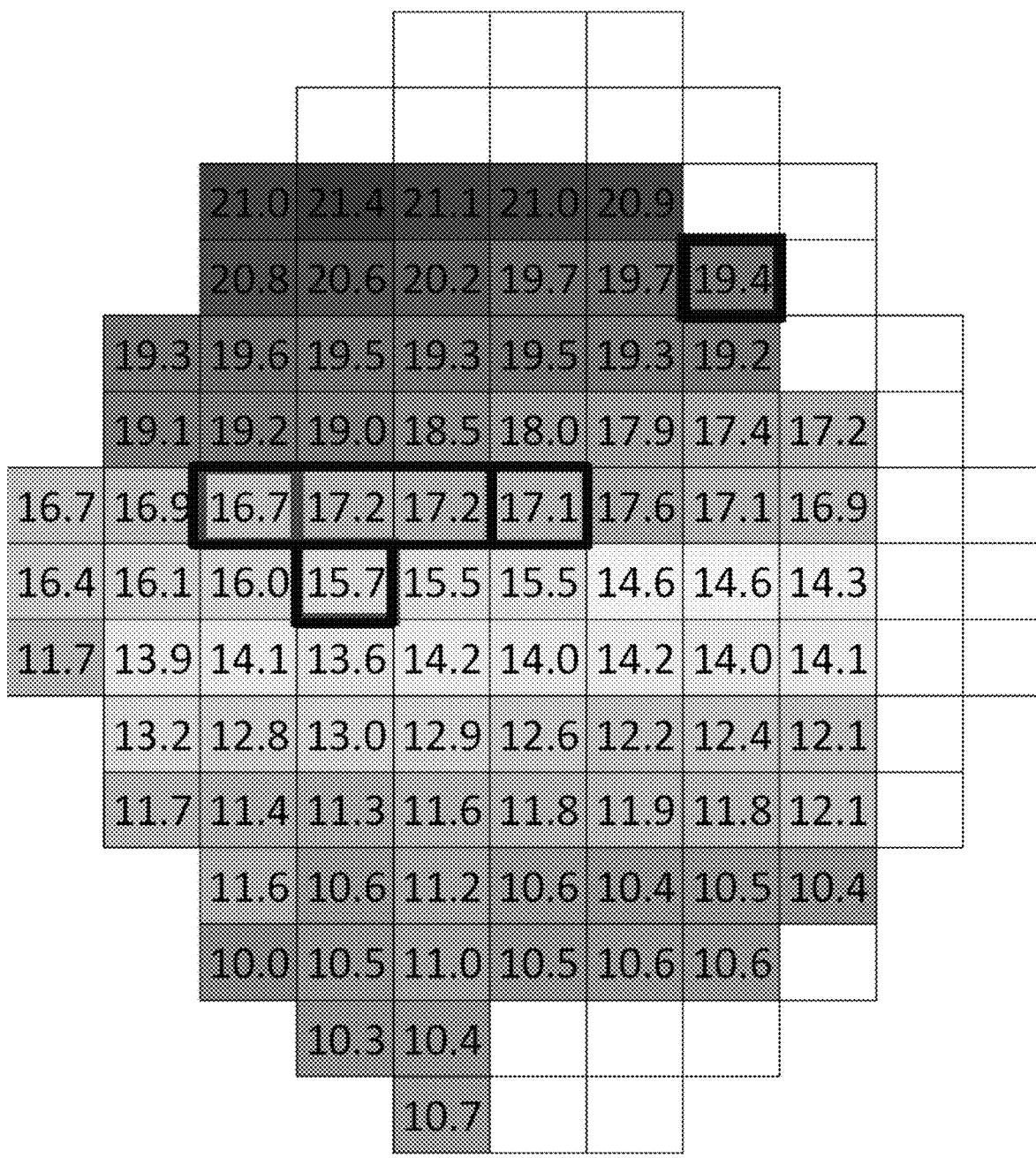
FIG. 4 is an exemplary wafer heat map.

FIG. 4 is an exemplary wafer heat map of mean diameter (e.g., critical dimension) of 100 contact holes in one SEM image from each die. EUV stochastics are present in this example. The EUV stochastics can be a gating factor for EUV in high volume manufacturing. In this example, EUV lithography (13.5 nm light) can be a scaling enabler (<7 nm node). The stochastics can be random (e.g., local and/or global) structural variations. The root causes can be materials, scanner parameters, or structural dependencies.

In an SEM images of the three dies in the thick black border in the heat map of FIG. 4 (mean diameters of 16.7, 17.2, and 17.2), all the individual contact holes that are smaller than 10% of the mean critical dimension of the 100 contact holes from the corresponding image were used to train the deep learning model to be identified as defective. Using this deep learning model, the SEM images from the three individual dies marked with a thick border (mean diameters of 15.7, 17.1, and 19.4) were used as verification images to assess the performance of the deep learning model in identifying defective contact holes.

Figure 5:
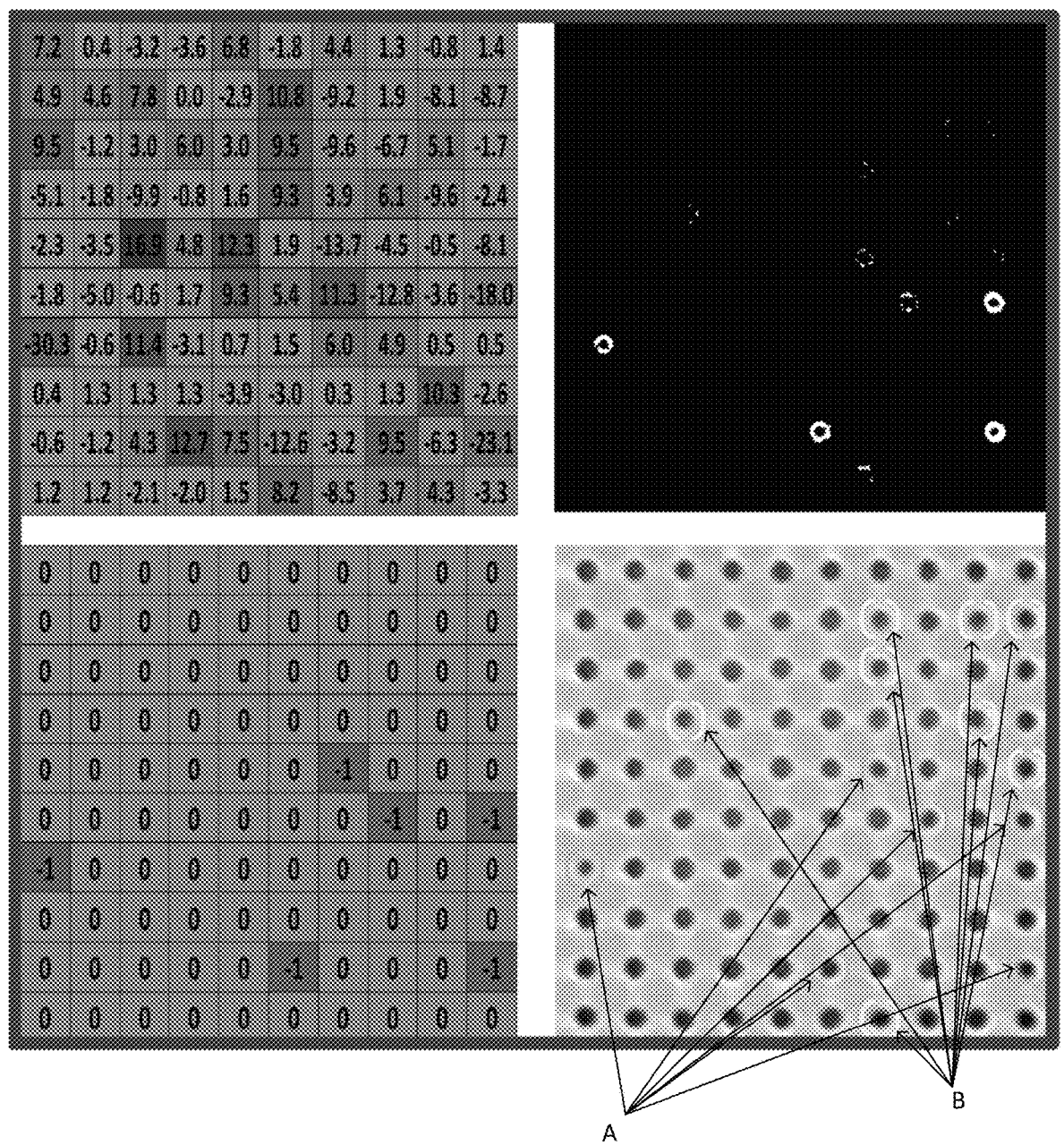
FIG. 5 illustrates a chart of deviation percentage for diameter of individual contact holes from the average diameter of the 1×1 μm SEM field of view (upper left), a binary image showing the pixels that are considered defective after being thresholded (upper right), the 1×1 μm SEM image of the 10×10 contact hole matrix (bottom right), and results (bottom left) for the region of FIG. 4 with the thick box and value of 16.7.
Figure 6:
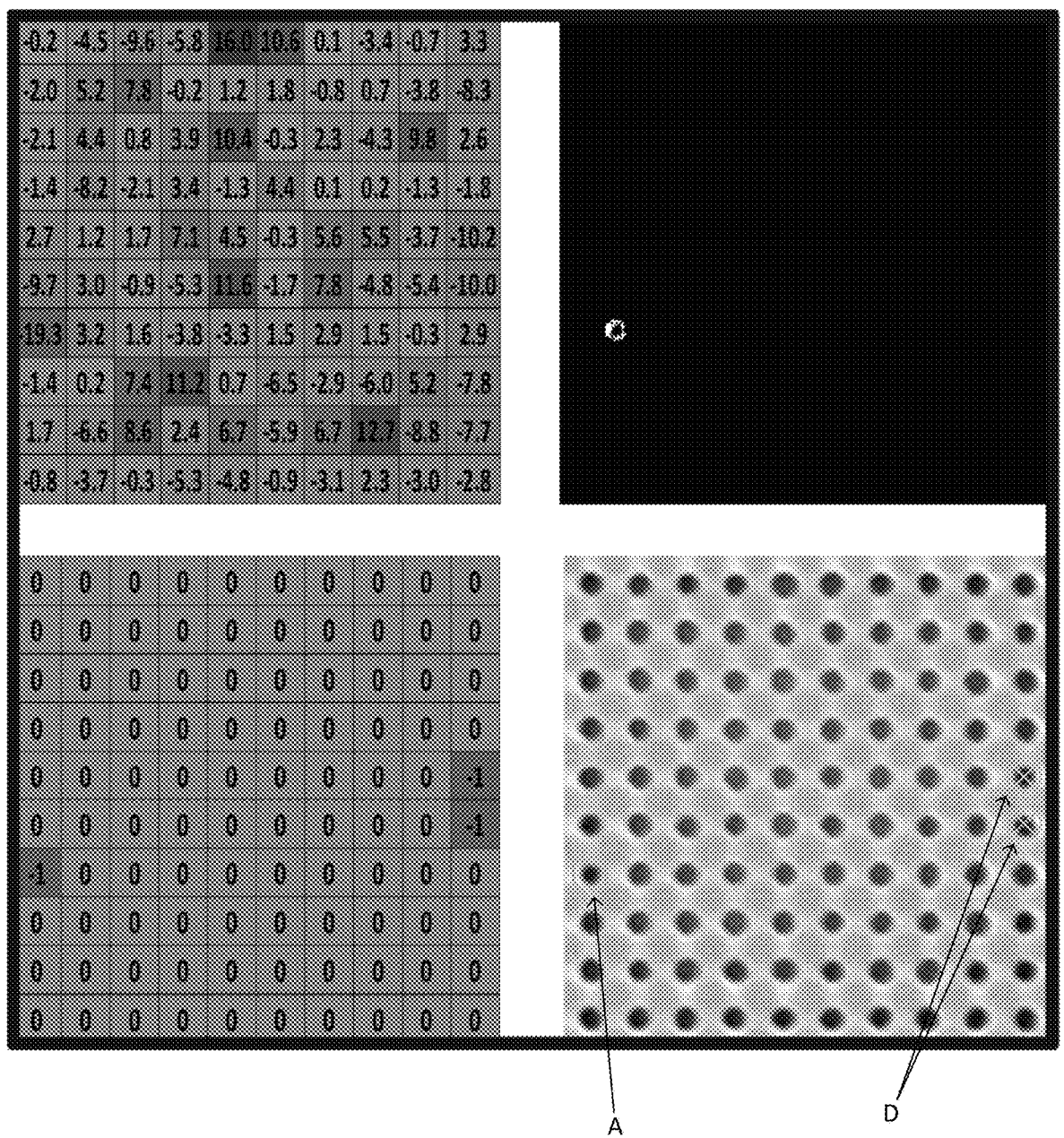
FIG. 6 illustrates a chart of deviation percentage for diameter of individual contact holes from the average diameter of the 1×1 μm SEM field of view (upper left), a binary image showing the pixels that are considered defective after being thresholded (upper right), the 1×1 μm SEM image of the 10×10 contact hole matrix (bottom right), and results (bottom left) for the region of FIG. 4 with the thick box and value of 19.4.
Figure 7:
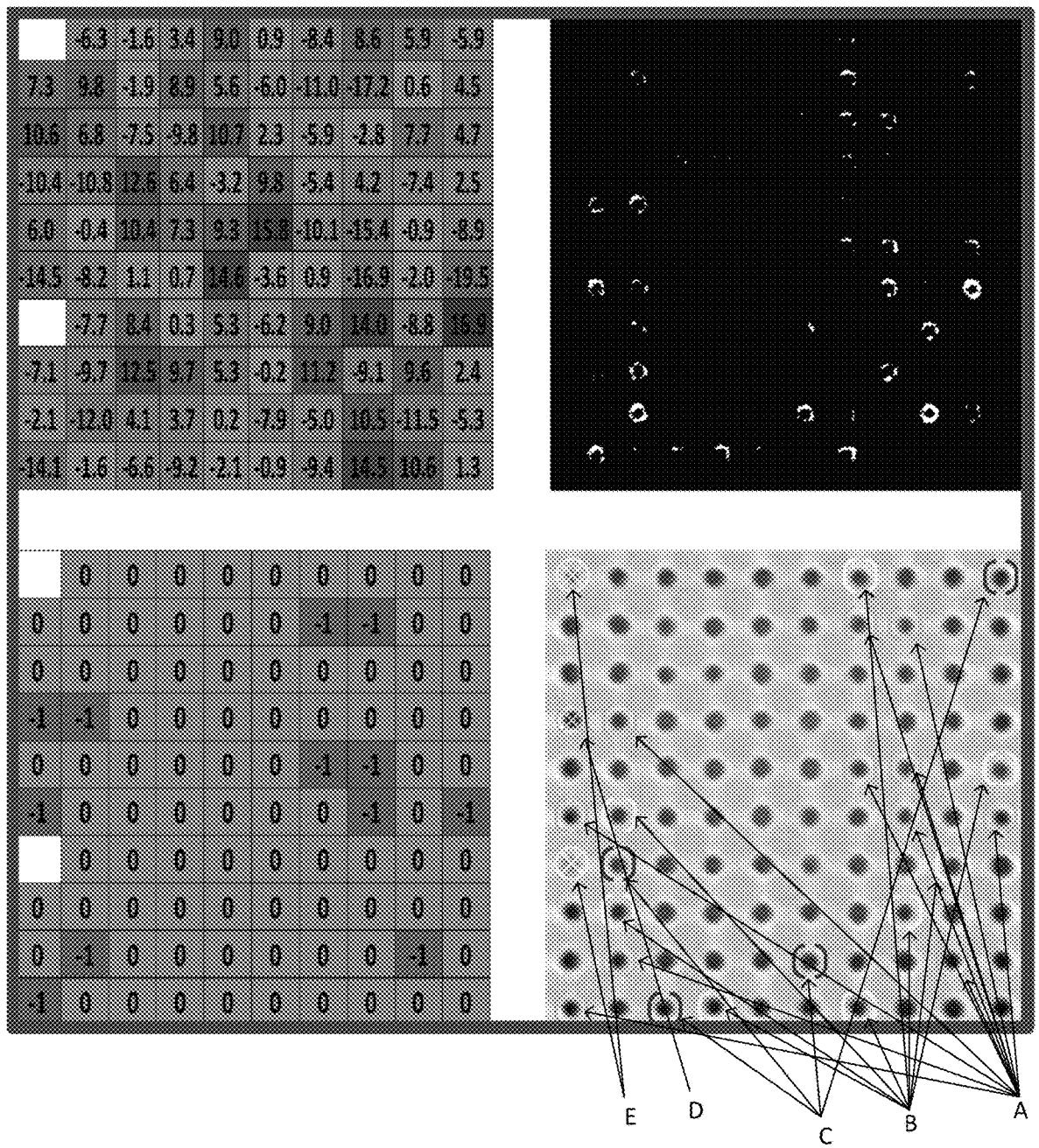
FIG. 7 illustrates a chart of deviation percentage for diameter of individual contact holes from the average diameter of the 1×1 μm SEM field of view (upper left), a binary image showing the pixels that are considered defective after being thresholded (upper right), the 1×1 μm SEM image of the 10×10 contact hole matrix (bottom right), and results (bottom left) for the region of FIG. 4 with the thick box and value of 15.7.

In FIGS. 5-8, the bottom right image shows a 1×1 μm SEM image of the contact hole matrix. This is a 10×10 matrix with 100 contacts. The top left image in FIGS. 5-8 shows a percent deviation of diameter for individual contact hole from the average diameter of the 1×1 μm SEM field of view. The top right image in FIGS. 5-8 shows a binary image showing the pixels that are considered defective after being thresholded. Pixels that are missing on the shrunk contact holes, if present, would have made the diameter of these contacts similar to the average diameter of the SEM field of view. This is used to calculate the number of pixels that failed. The bottom left image in FIGS. 5-8 shows contact holes that are smaller by more than 10% from the average diameter of the SEM field of view, which are tagged with a −1. The contacts that are tagged as 0 are not shrunk by more than 10% from the average of the SEM field of view. FIG. 5 corresponds to the region of FIG. 4 with the thick box and value of 16.7. FIG. 6 corresponds to the region of FIG. 4 with the thick box and value of 19.4. FIG. 7 corresponds to the region of FIG. 4 with the thick box and value of 15.7. FIG. 8 corresponds to the region of FIG. 4 with the thick box and value of 17.1.

In FIGS. 5-8, labels A-F represent the following. A represents a real defect capture (CH shrink >10%). B represents an acceptable nuisance (CH shrink <<8-10%). C represents a gross nuisance (CH shrink <<10%). D represents an acceptable miss (CH shrink=8-10%). E represents a defect type that is not annotated. F represents a gross miss (CH shrink >>10%). These labels are also shown in FIG. 13.

FIG. 9 is a chart of critical dimension diameter of the contact holes in the SEM image of FIG. 5. FIG. 10 is a chart of critical dimension diameter of the contact holes in the SEM image of FIG. 6. FIG. 11 is a chart of critical dimension diameter of the contact holes in the SEM image of FIG. 7. FIG. 12 is a chart of critical dimension diameter of the contact holes in the SEM image of FIG. 8.

In FIG. 5, the SFR is $4.7 \times 10^{-3}$/Thr=60. In FIG. 6, the SFR is $7.6 \times 10^{-4}$/Thr=50. In FIG. 7, the SFR is $8.2 \times 10^{-3}$/Thr=65. In FIG. 8, the SFR is $3.3 \times 10^{-3}$/Thr=60.

FIG. 13 is a table of results for the images of FIGS. 5-8. As seen in the results, SMARTS is sensitive to CD changes of approximately 2% accuracy from the training set. These results demonstrate that deep learning detection algorithms can successfully quantify EUV stochastics rate or other pixel level quantifications. It is expected that a similar exercise for line/space structures to quantify a number of defective pixels caused by bridges, protrusions, or opens would likewise be successful. Training (e.g., D2DB training) can be further optimized to reduce nuisance.

Figure 14:
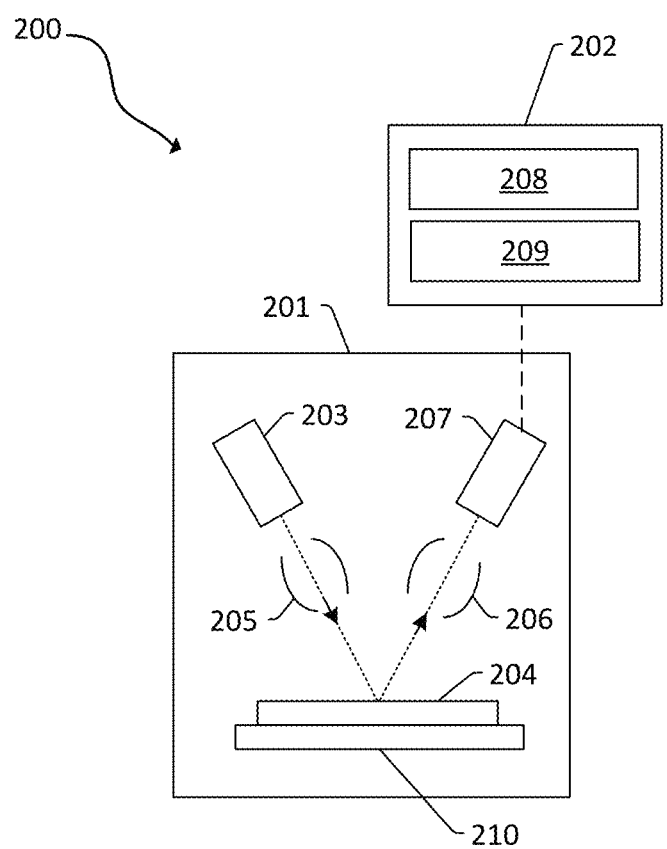
FIG. 14 is a block diagram of a system in accordance with the present disclosure.

FIG. 14 is a block diagram of a system 200. The system 200 includes a wafer inspection tool (which includes the electron column 201) configured to generate images of a wafer 204. The system 200 also can be configured as a review tool instead of an inspection tool.

The wafer inspection tool includes an output acquisition subsystem that includes at least an energy source and a detector. The output acquisition subsystem may be an electron beam-based output acquisition subsystem. For example, in one embodiment, the energy directed to the wafer 204 includes electrons, and the energy detected from the wafer 204 includes electrons. In this manner, the energy source may be an electron beam source. In one such embodiment shown in FIG. 14, the output acquisition subsystem includes electron column 201, which is coupled to computer subsystem 202. A stage 210 may hold the wafer 204.

As also shown in FIG. 14, the electron column 201 includes an electron beam source 203 configured to generate electrons that are focused to wafer 204 by one or more elements 205. The electron beam source 203 may include, for example, a cathode source or emitter tip. The one or more elements 205 may include, for example, a gun lens, an anode, a beam limiting aperture, a gate valve, a beam current selection aperture, an objective lens, and a scanning subsystem, all of which may include any such suitable elements known in the art.

Electrons returned from the wafer 204 (e.g., secondary electrons) may be focused by one or more elements 206 to detector 207. One or more elements 206 may include, for example, a scanning subsystem, which may be the same scanning subsystem included in element(s) 205.

The electron column 201 also may include any other suitable elements known in the art.

Although the electron column 201 is shown in FIG. 14 as being configured such that the electrons are directed to the wafer 204 at an oblique angle of incidence and are scattered from the wafer 204 at another oblique angle, the electron beam may be directed to and scattered from the wafer 204 at any suitable angles. In addition, the electron beam-based output acquisition subsystem may be configured to use multiple modes to generate images of the wafer 204 (e.g., with different illumination angles, collection angles, etc.). The multiple modes of the electron beam-based output acquisition subsystem may be different in any image generation parameters of the output acquisition subsystem.

Computer subsystem 202 may be coupled to detector 207 as described above. The detector 207 may detect electrons returned from the surface of the wafer 204 thereby forming electron beam images of the wafer 204. The electron beam images may include any suitable electron beam images. Computer subsystem 202 may be configured to perform any of the functions described herein using the output of the detector 207 and/or the electron beam images. Computer subsystem 202 may be configured to perform any additional step(s) described herein. A system 200 that includes the output acquisition subsystem shown in FIG. 14 may be further configured as described herein.

It is noted that FIG. 14 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 14 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 202 includes a processor 208 and an electronic data storage unit 209. The processor 208 may include a microprocessor, a microcontroller, or other devices.

The computer subsystem 202 may be coupled to the components of the system 200 in any suitable manner (e.g., via one or more transmission media, which may include wired and/or wireless transmission media) such that the processor 208 can receive output. The processor 208 may be configured to perform a number of functions using the output. The wafer inspection tool can receive instructions or other information from the processor 208. The processor 208 and/or the electronic data storage unit 209 optionally may be in electronic communication with another wafer inspection tool, a wafer metrology tool, or a wafer review tool (not illustrated) to receive additional information or send instructions.

The processor 208 is in electronic communication with the wafer inspection tool, such as the detector 207. The processor 208 may be configured to process images generated using measurements from the detector 207 and quantify a number of pixels in the image that exceed a corresponding threshold in the matrix. For example, the processor may perform embodiments of the method 100.

The computer subsystem 202, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 208 and electronic data storage unit 209 may be disposed in or otherwise part of the system 200 or another device. In an example, the processor 208 and electronic data storage unit 209 may be part of a standalone control unit or in a centralized quality control unit. Multiple processors 208 or electronic data storage units 209 may be used.

The processor 208 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 208 to implement various methods and functions may be stored in readable storage media, such as a memory in the electronic data storage unit 209 or other memory.

If the system 200 includes more than one computer subsystem 202, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 208 may be configured to perform a number of functions using the output of the system 200 or other output. For instance, the processor 208 may be configured to send the output to an electronic data storage unit 209 or another storage medium. The processor 208 may be further configured as described herein.

The processor 208 or computer subsystem 202 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 208 may be configured according to any of the embodiments described herein. The processor 208 also may be configured to perform other functions or additional steps using the output of the system 200 or using images or data from other sources.

In an instance, the processor 208 is in electronic communication with the detector 207. The processor 208 is configured to represent a heat map of probable defects in an image as a matrix of defect probability index corresponding to each pixel. The image generated from data received from the detector. The processor 208 also is configured to quantify a number of pixels in the image that exceed a corresponding threshold in the matrix. The corresponding threshold for one of the pixels is at a same location as that pixel. The processor 208 also can be configured to determine the heat map.

The processor 208 may operate a deep learning module that is configured to receive an image, perform defect detection on the image, and perform defect classification on the image. The deep learning module may be a neural network, such as a convolution neural network, or some other type of deep learning system.

The processor 208 may be communicatively coupled to any of the various components or sub-systems of system 200 in any manner known in the art. Moreover, the processor 208 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 208 and other subsystems of the system 200 or systems external to system 200.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 208 (or computer subsystem 202) or, alternatively, multiple processors 208 (or multiple computer subsystems 202). Moreover, different sub-systems of the system 200 may include one or more computing or logic systems. Therefore, the above description should not be interpreted as a limitation on the present disclosure but merely an illustration.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
an electron beam source that generates an electron beam;
a stage configured to hold a wafer in a path of the electron beam;
a detector configured to receive the electron beam returned from the wafer;
a processor in electronic communication with the detector; and
a deep learning module operated by the processor, wherein the deep learning module is configured to:
receive an image generated from data received from the detector: and
perform defect detection and defect classification on the image thereby determining probable defects:
wherein in the processor is configured to:
represent a heat map of the probable defects from the deep learning module in the image as a matrix of defect probability index corresponding to each pixel of the image, wherein the heat map includes at least some of the wafer and is based on measurements of features in the image; and
quantify a number of pixels in the image that exceed a corresponding threshold in the matrix.

2. The system of claim 1, wherein the processor is further configured to determine the heat map.

3. The system of claim 1, wherein the corresponding threshold for one of the pixels is at a same location on the image as the one of the pixels.

4. The system of claim 1, wherein the quantifying is used in pixel level image quantification.

5. The system of claim 1, wherein the probable defects are EUV stochastics.

6. The system of claim 1, wherein the probable defects are critical dimension defects.

7. The system of claim 1, wherein the image is a scanning electron microscope image.

8. A method comprising:
receiving an image at a processor:
performing defect detection and defect classification on the image using a deep learning module of the processor thereby determining probable defects:
representing a heat map of the probable defects from the deep learning module in the image as a matrix of defect probability index corresponding to each pixel using a processor, wherein the image is generated from data received from a detector, and wherein the heat map includes at least some of the wafer and is based on measurements of features in the image; and
quantifying, using the processor, a number of pixels in the image that exceed a corresponding threshold in the matrix.

9. The method of claim 8, further comprising determining the heat map using the processor.

10. The method of claim 8, wherein the corresponding threshold for one of the pixels is at a same location on the image as the one of the pixels.

11. The method of claim 8, wherein the quantifying is used in pixel level image quantification.

12. The method of claim 8, wherein the probable defects are EUV stochastics.

13. The method of claim 8, wherein the probable defects are critical dimension defects.

14. The method of claim 8, wherein the image is a scanning electron microscope image.

15. The method of claim 8, further comprising:
directing an electron beam at the wafer;
collecting electrons returned from the wafer with a detector; and
generating, using the processor, the image of the wafer.

16. A non-transitory computer readable medium storing a program configured to instruct a processor to execute the method of claim 8.

17. The system of claim 1, wherein the heat map displays mean diameters.

18. The method of claim 8, wherein the heat map displays mean diameters.

* * * * *